United States Patent
Saito et al.

(10) Patent No.: US 12,009,287 B2
(45) Date of Patent: Jun. 11, 2024

(54) SEMICONDUCTOR DEVICE WITH PACKAGING MATERIAL AND METAL MEMBER PROTRUDING FROM THE PACKAGING MATERIAL

(71) Applicant: ROHM CO., LTD., Kyoto (JP)

(72) Inventors: Koshun Saito, Kyoto (JP); Keiichi Takahashi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 112 days.

(21) Appl. No.: 16/491,499

(22) PCT Filed: Mar. 5, 2018

(86) PCT No.: PCT/JP2018/008377
§ 371 (c)(1),
(2) Date: Sep. 5, 2019

(87) PCT Pub. No.: WO2018/180255
PCT Pub. Date: Oct. 4, 2018

(65) Prior Publication Data
US 2020/0035587 A1    Jan. 30, 2020

(30) Foreign Application Priority Data

Mar. 28, 2017 (JP) .................................. 2017-063198

(51) Int. Cl.
*H01L 23/495* (2006.01)
*H01L 21/48* (2006.01)
(Continued)

(52) U.S. Cl.
CPC .... *H01L 23/49562* (2013.01); *H01L 21/4825* (2013.01); *H01L 21/4842* (2013.01);
(Continued)

(58) Field of Classification Search
CPC ........... H01L 23/49562; H01L 23/3114; H01L 23/49568; H01L 21/4825; H01L 21/4842; H01L 21/565
(Continued)

(56) References Cited

U.S. PATENT DOCUMENTS 6,373,125 B1 * 4/2002 Pannaccione ....... H01L 23/3114
257/666
8,207,601 B2 * 6/2012 Low .................. H01L 23/49562
257/676
(Continued)

FOREIGN PATENT DOCUMENTS

JP   S49103375    9/1974
JP   S5577160 A   6/1980
(Continued)

OTHER PUBLICATIONS

International Search Report and Written Opinion issued for International Patent Application No. PCT/JP2018/008377, dated May 29, 2018, 8 pages including English translation of Search Report.
(Continued)

*Primary Examiner* — Eric W Jones
(74) *Attorney, Agent, or Firm* — Hamre, Schumann, Mueller & Larson, P.C.

(57) ABSTRACT

A semiconductor device includes a semiconductor element, a packaging material that encapsulates the semiconductor element, and a metal member electrically connected to the semiconductor element and having a protruding portion protruding from an end face of the packaging material, in which the protruding portion has a lateral peripheral edge along the end face of the packaging material, a longitudinal peripheral edge along the normal direction of the end face, and a corner peripheral edge formed by side portions that are disposed at the corners of the protruding portion and continue to the lateral peripheral edge and the longitudinal
(Continued)

peripheral edge, and in which the corner peripheral edge includes a first side portion intersecting substantially orthogonally with the lateral peripheral edge and extending toward the end face of the packaging material and a second side portion with one end thereof intersecting substantially orthogonally with the first side portion and the other end intersecting substantially orthogonally with the longitudinal peripheral edge.

19 Claims, 13 Drawing Sheets

(51) Int. Cl.
  *H01L 21/56* (2006.01)
  *H01L 23/31* (2006.01)
(52) U.S. Cl.
  CPC ........ *H01L 21/565* (2013.01); *H01L 23/3114* (2013.01); *H01L 23/49568* (2013.01)
(58) Field of Classification Search
  USPC ........................................................ 257/675
  See application file for complete search history.

(56) References Cited

U.S. PATENT DOCUMENTS

| | | | |
|---|---|---|---|
| 9,620,442 B2 * | 4/2017 | Shimada | H01L 23/49551 |
| 2006/0261473 A1 * | 11/2006 | Connah | H01L 23/15 |
| | | | 257/728 |
| 2008/0173991 A1 * | 7/2008 | Cruz | H01L 24/36 |
| | | | 257/676 |
| 2008/0290484 A1 * | 11/2008 | Low | H01L 24/97 |
| | | | 257/E23.044 |
| 2009/0129038 A1 * | 5/2009 | Takakusaki | H05K 1/0203 |
| | | | 361/772 |
| 2012/0075816 A1 * | 3/2012 | Mashimo | H01L 23/3121 |
| | | | 361/760 |
| 2013/0194752 A1 * | 8/2013 | Marbella | H01L 23/34 |
| | | | 361/719 |
| 2015/0380384 A1 * | 12/2015 | Williams | H01L 21/4842 |
| | | | 438/112 |

FOREIGN PATENT DOCUMENTS

| | | |
|---|---|---|
| JP | H07307424 | 11/1995 |
| JP | H11123471 | 5/1999 |
| JP | 2015092609 | 5/2015 |

OTHER PUBLICATIONS

International Preliminary Report on Patentability issued for International Patent Application No. PCT/JP2018/008377, dated Oct. 10, 2019, 11 pages including English translation.
Office Action issued for Chinese Patent Application No. 201880022238.0, dated Nov. 17, 2022, 20 pages including English machine translation.
Second Office Action issued for Chinese Patent Application No. 201880022238.0, dated May 6, 2023, 18 pages including English machine translation.

* cited by examiner

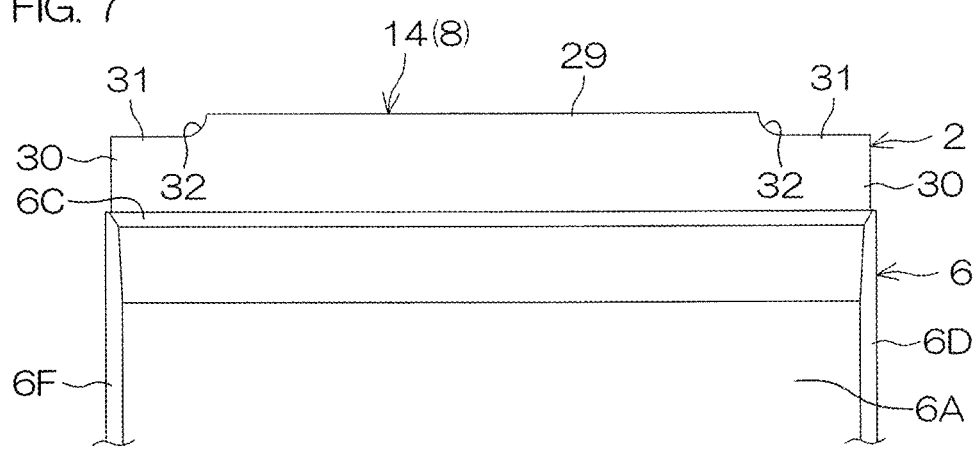

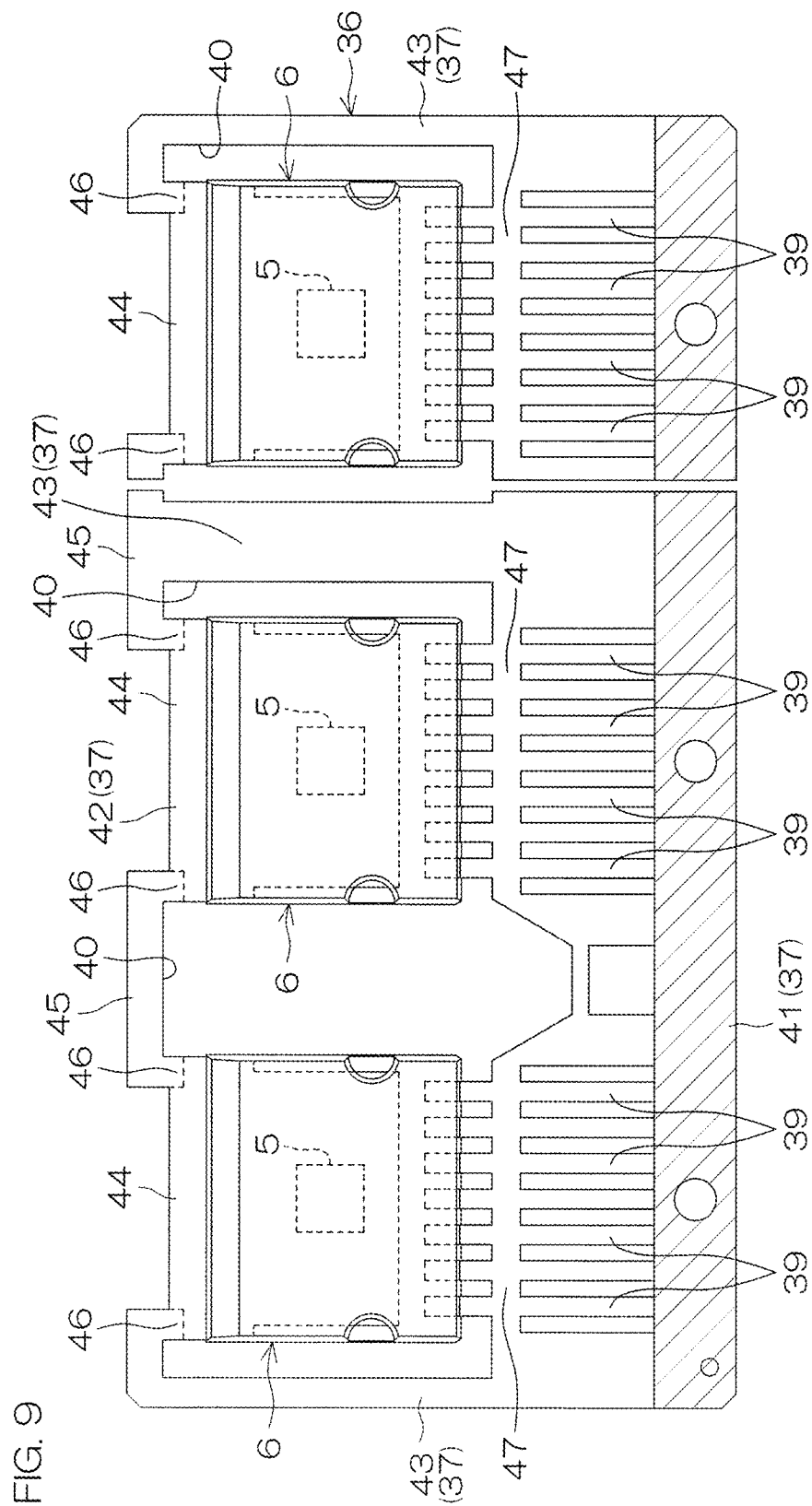

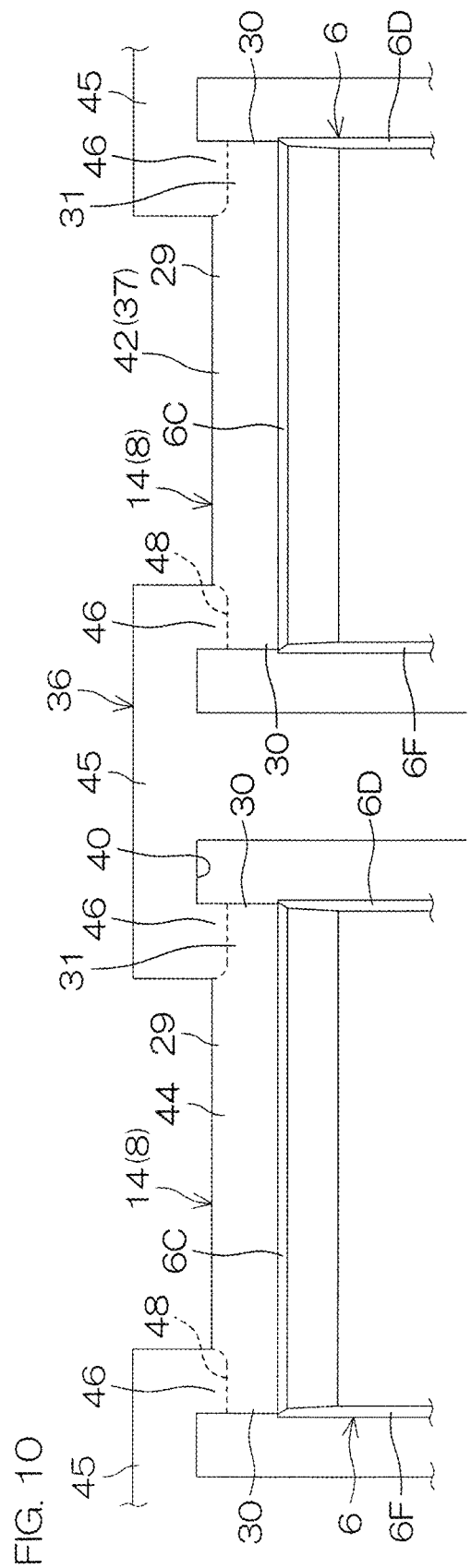

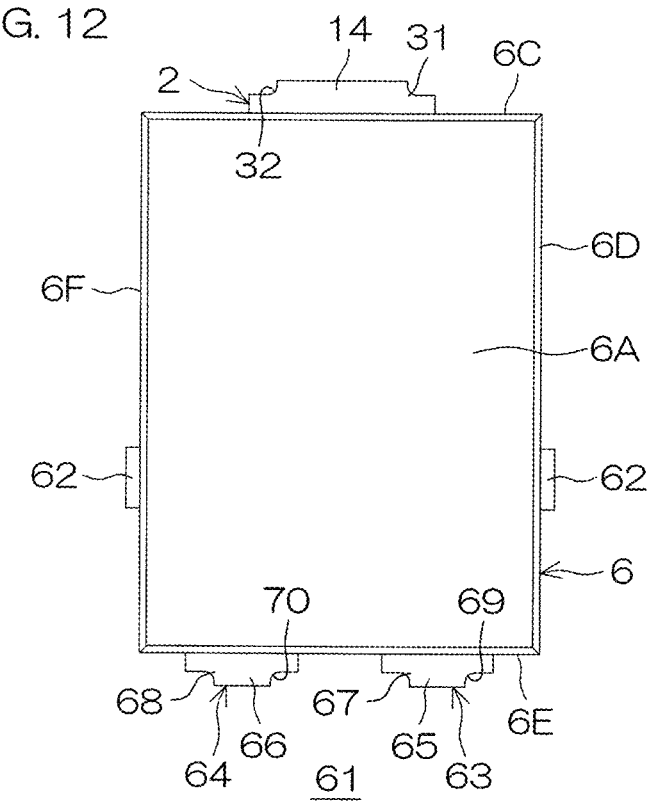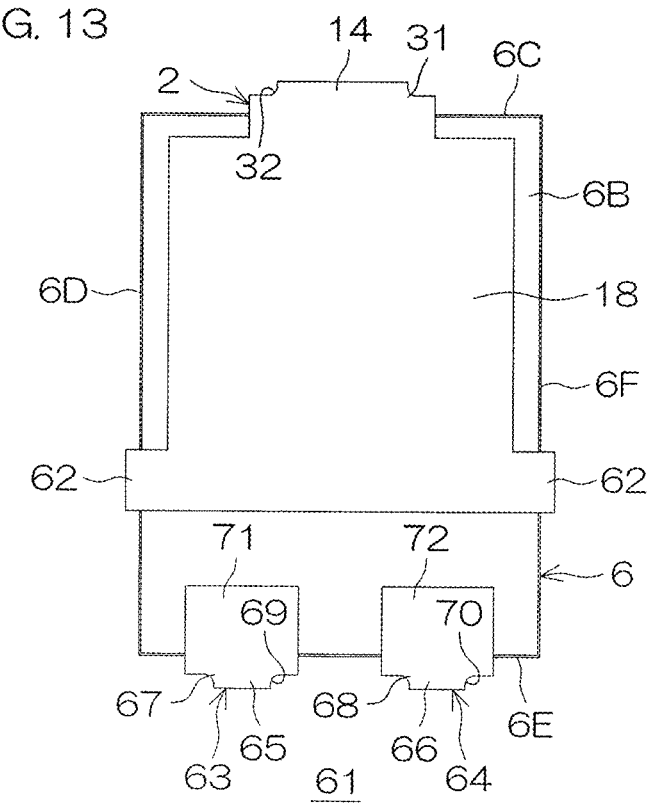

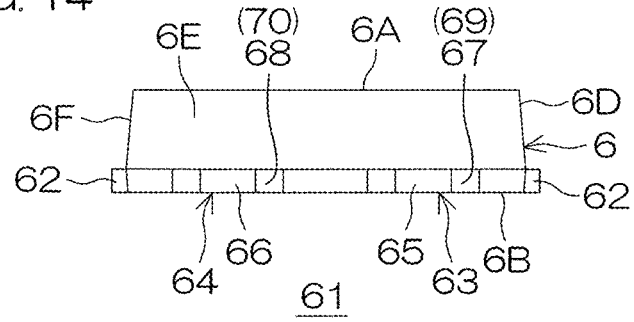
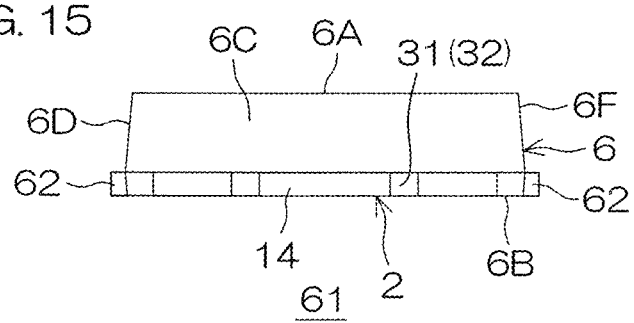
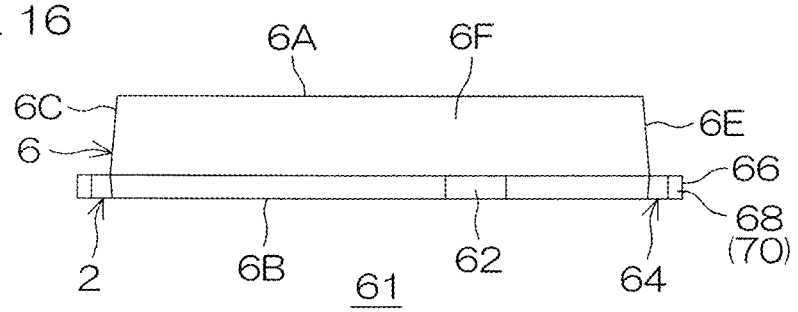
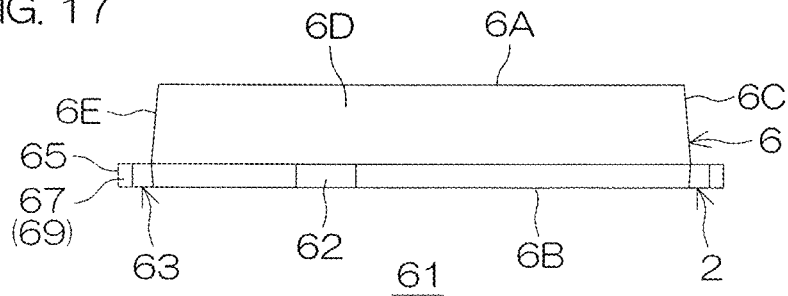

(Comparative example)

⟨Reference example⟩

SEMICONDUCTOR DEVICE WITH PACKAGING MATERIAL AND METAL MEMBER PROTRUDING FROM THE PACKAGING MATERIAL

TECHNICAL FIELD

The present invention relates to a semiconductor device and a method for manufacturing the same.

BACKGROUND ART

Patent Literature 1, for example, discloses a semiconductor package including a switching element, a drain lead, a source lead, and a gate lead electrically connected to the switching element, an encapsulation body that encapsulates the switching element such that the leads are partially exposed, and a heat dissipation fin protruding from the encapsulation body. The corners of the heat dissipation fin are each formed by a linear side portion inclined with respect to the leading end edge of the heat dissipation fin.

CITATION LIST

Patent Literature

Patent Literature 1: Japanese Patent Application Publication No. 2015-92609

SUMMARY OF INVENTION

Technical Problem

The shape of a metal member such as a heat dissipation fin as described in Patent Literature 1 is defined by a cut shape that appears when a lead frame is cut in a predetermined pattern during production.

However, when a lead frame is cut in a pattern such as the corners of the heat dissipation fin described in Patent Literature 1, an unnecessary protrusion (burr) may remain at each corner of the heat dissipation fin. Such a burr, which could be a factor in causing a short circuit when the semiconductor package is mounted, should not preferably remain.

It is hence an object of the present invention to provide a reliable semiconductor device with no burr around the peripheral edge of a metal member protruding from a packaging material.

It is another object of the present invention to provide a method for manufacturing a semiconductor device that can reduce the occurrence of a burr around the peripheral edge of a metal member protruding from a packaging material after cutting a lead frame.

Solution to Problem

A semiconductor device according to a preferred embodiment of the present invention includes a semiconductor element, a packaging material that encapsulates the semiconductor element, and a metal member electrically connected to the semiconductor element and having a protruding portion protruding from an end face of the packaging material, in which the protruding portion has a lateral peripheral edge along the end face of the packaging material, a longitudinal peripheral edge along the normal direction of the end face, and a corner peripheral edge formed by side portions that are disposed at the corners of the protruding portion and continue to the lateral peripheral edge and the longitudinal peripheral edge, and in which the corner peripheral edge includes a first side portion intersecting substantially orthogonally with the lateral peripheral edge and extending toward the end face of the packaging material and a second side portion with one end thereof intersecting substantially orthogonally with the first side portion and the other end intersecting substantially orthogonally with the longitudinal peripheral edge.

The semiconductor device can be manufactured by a semiconductor device manufacturing method according to a preferred embodiment of the present invention. The semiconductor device manufacturing method includes a step of mounting a semiconductor element on a lead frame, a step of encapsulating the semiconductor element with a packaging material such that the lead frame is partially exposed, and a step of cutting the lead frame in a predetermined pattern to separate the packaging material from the lead frame while leaving the lead frame remaining on the packaging material side as a metal member that has a protruding portion protruding from an end face of the packaging material, in which the peripheral edge of the protruding portion that appears by cutting the predetermined pattern has a lateral peripheral edge along the end face of the packaging material, a longitudinal peripheral edge along the normal direction of the end face, and a corner peripheral edge formed by side portions that are disposed at the corners of the protruding portion and continue to the lateral peripheral edge and the longitudinal peripheral edge, and in which the corner peripheral edge includes a first side portion intersecting substantially orthogonally with the lateral peripheral edge and extending toward the end face of the packaging material and a second side portion with one end thereof intersecting substantially orthogonally with the first side portion and the other end intersecting substantially orthogonally with the longitudinal peripheral edge.

In accordance with the method, since the lead frame is cut in a pattern in which the corner peripheral edge of the protruding portion includes the above-described first side portion and the second side portion, it is possible to reduce the occurrence of a burr at the corners of the protruding portion after cutting. Accordingly, the resulting semiconductor device has no burr remaining around the peripheral edge of the metal member and thereby a highly reliable semiconductor device can be provided.

In the semiconductor device according to a preferred embodiment of the present invention, the intersecting portion between the first side portion and the second side portion may be defined in a curved shape.

In the semiconductor device according to a preferred embodiment of the present invention, an angle θ1 between the lateral peripheral edge and the first side portion, an angle θ2 between the first side portion and the second side portion, and an angle θ3 between the second side portion and the longitudinal peripheral edge may all be 90 degrees.

In the semiconductor device according to a preferred embodiment of the present invention, the ratio (L1/L2) between the length L1 of the first side portion and the length L2 of the second side portion may be within the range of 1/10 to 10.

In the semiconductor device according to a preferred embodiment of the present invention, the thickness T1 of the protruding portion may be 0.1 mm to 2 mm and the protrusion amount L3 of the protruding portion from the end face of the packaging material may be 0.1 mm to 2 mm.

In the semiconductor device according to a preferred embodiment of the present invention, the second side portion may be defined in parallel with the lateral peripheral edge.

In the semiconductor device according to a preferred embodiment of the present invention, the second side portion may be defined to be inclined with respect to the lateral peripheral edge.

In the semiconductor device according to a preferred embodiment of the present invention, an end face of the protruding portion may include a plating region covering an area from a secondary surface side of the protruding portion to the middle in the thickness direction and a base region of the metal member covering an area from a primary surface side of the protruding portion to the plating region.

In the semiconductor device according to a preferred embodiment of the present invention, the protruding portion of the metal member may include a heat dissipation fin to dissipate heat generated in the semiconductor device.

In the semiconductor device according to a preferred embodiment of the present invention, the semiconductor element may include a transistor chip, and the metal member may include a drain terminal connected to the drain of the transistor chip.

In the semiconductor device according to a preferred embodiment of the present invention, the semiconductor element may include a transistor chip, and the metal member may include a source terminal connected to the source of the transistor chip.

In the semiconductor device according to a preferred embodiment of the present invention, the semiconductor element may include a transistor chip, and the metal member may include a gate terminal connected to the gate of the transistor chip.

In the semiconductor device manufacturing method according to a preferred embodiment of the present invention, the step of cutting the lead frame may include the step of cutting a portion of the lead frame not supported on a support member from a secondary side of the lead frame while a portion remains as the protruding portion of the metal member supported through a primary side of the lead frame on the support member.

In the semiconductor device manufacturing method according to a preferred embodiment of the present invention, the step of cutting the lead frame may include the step of stamping an unnecessary portion of the lead frame not supported on the support member with a stamping member.

BRIEF DESCRIPTION OF DRAWINGS

FIG. 7 is an enlarged view of a portion surrounded by alternate long and short dashed lines VII in FIG. 1.

FIG. 9 is a schematic plan view of a lead frame according to a preferred embodiment of the present invention.

FIG. 10 is a substantial portion enlarged view of the lead frame.

FIG. 12 is a plan view of a semiconductor device according to another preferred embodiment of the present invention.

FIG. 13 is a bottom view of the semiconductor device according to another preferred embodiment of the present invention.

FIG. 14 is a front view of the semiconductor device according to another preferred embodiment of the present invention.

FIG. 15 is a back view of the semiconductor device according to another preferred embodiment of the present invention.

FIG. 16 is a left side view of the semiconductor device according to another preferred embodiment of the present invention.

FIG. 17 is a right side view of the semiconductor device according to another preferred embodiment of the present invention.

DESCRIPTION OF EMBODIMENTS

Preferred embodiments of the present invention will hereinafter be described in detail with reference to the accompanying drawings.

Figure 1:
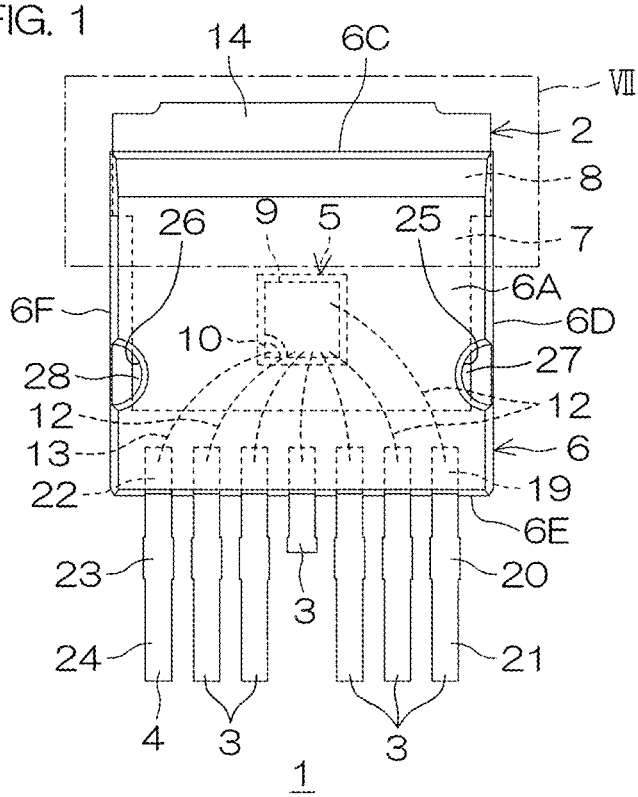
FIG. 1 is a plan view of a semiconductor device according to a preferred embodiment of the present invention.
Figure 2:
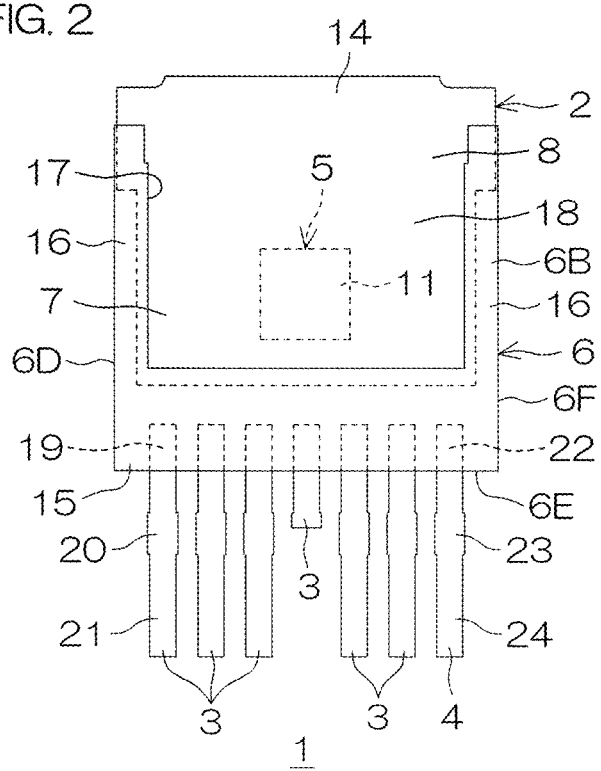
FIG. 2 is a bottom view of the semiconductor device according to the preferred embodiment of the present invention.
Figure 3:
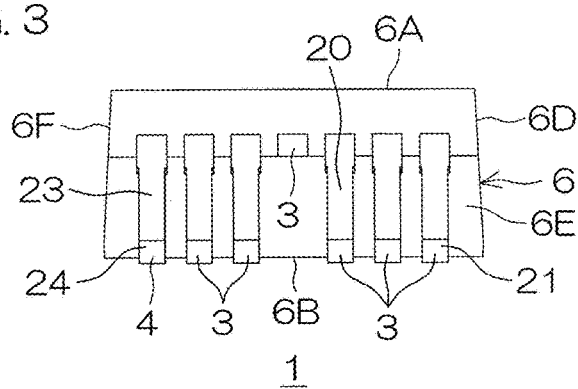
FIG. 3 is a front view of the semiconductor device according to the preferred embodiment of the present invention.
Figure 4:
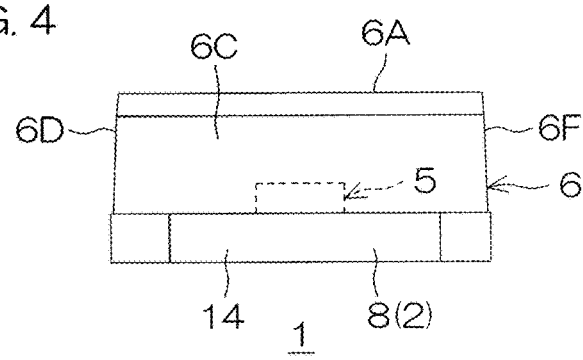
FIG. 4 is a back view of the semiconductor device according to the preferred embodiment of the present invention.
Figure 5:
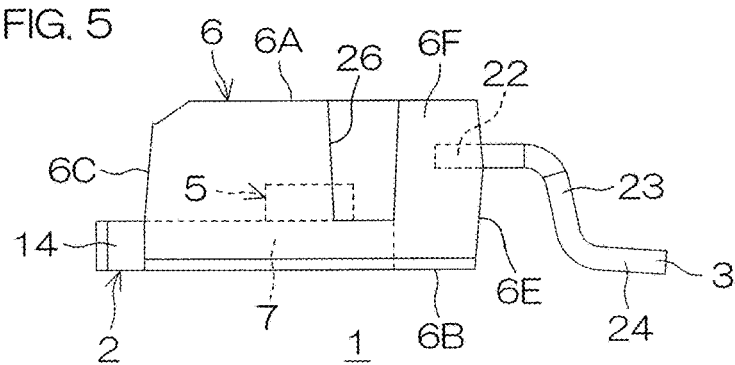
FIG. 5 is a left side view of the semiconductor device according to the preferred embodiment of the present invention.
Figure 6:
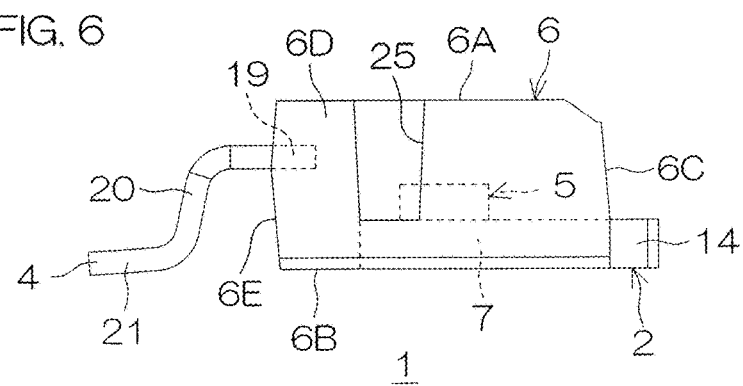
FIG. 6 is a right side view of the semiconductor device according to the preferred embodiment of the present invention.

FIG. 1 is a plan view of a semiconductor device 1 according to a preferred embodiment of the present invention. FIG. 2 is a bottom view of the semiconductor device 1 according to the preferred embodiment of the present invention. FIG. 3 is a front view of the semiconductor device 1 according to the preferred embodiment of the present invention. FIG. 4 is a back view of the semiconductor device 1 according to the preferred embodiment of the present invention. FIG. 5 is a left side view of the semiconductor device 1 according to the preferred embodiment of the present invention. FIG. 6 is a right side view of the semiconductor device 1 according to the preferred embodiment of the present invention. It is noted that in FIGS. 1 to 6, the portions indicated by the broken lines are covered with a resin package 6 to be invisible in appearance.

The semiconductor device 1 is, for example, a surface-mounted power transistor capable of being incorporated in, for example, a power module used in an inverter circuit that constitutes a drive circuit arranged to drive an electric motor utilized as a power source for an electric vehicle (including a hybrid electric vehicle), a train, an industrial robot, and the like. It can also be incorporated in a power module used in an inverter circuit that converts electric power generated by a solar cell, a wind power generator, and other generators (particularly a private power generator) to match the commercial power.

The semiconductor device 1 includes multiple terminals 2, 3, 4 as an example of the metal member according to the present invention, a semiconductor element 5, and the resin package 6 as an example of the packaging material according to the present invention.

The semiconductor device 1 is not limited to a particular size but, in this preferred embodiment, may have, for example, a longitudinal dimension of 2 mm to 30 mm, a lateral dimension of 2 mm to 30 mm, and a thickness of 0.5 mm to 5 mm. In this preferred embodiment, the longitudinal direction corresponds to the direction (protruding direction) in which the multiple terminals 2, 3, 4 extend, while the lateral direction may correspond to the direction orthogonal to the longitudinal direction. It is noted that the size of the semiconductor device 1 described above indicates the size of the resin package 6.

The resin package 6 is defined to have a substantially rectangular parallelepiped shape that covers respective portions of the multiple terminals 2, 3, 4 and the semiconductor element 5. The resin package 6 has a primary surface 6A, a secondary surface 6B opposite thereto, and four end faces (side surfaces) 6C, 6D, 6E, 6F connecting the primary surface 6A and the secondary surface 6B. The end faces 6C and 6E face each other in the longitudinal direction and the end faces 6D and 6F face each other in the lateral direction. The resin package 6 is also composed of, for example, black epoxy resin.

The multiple terminals 2, 3, 4 include, for example, a drain terminal 2, a source terminal 3, and a gate terminal 4. The terminals 2, 3, 4 may be named differently depending on the type of the semiconductor element 5 mounted on the semiconductor device 1. For example, when the semiconductor element 5 is a MOSFET, the multiple terminals 2, 3, 4 are referred to as above, but when the semiconductor element 5 is an IGBT, the multiple terminals may be referred to, respectively, as collector terminal, emitter terminal, gate terminal. Alternatively, the multiple terminals 2, 3, 4 may be collectively referred to, respectively, as first external terminal, second external terminal, third external terminal.

The drain terminal 2, the source terminal 3, and the gate terminal 4 are each composed of a metal plate, preferably any one of Cu, Ni, an alloy thereof, 42-alloy, etc. The drain terminal 2, the source terminal 3, and the gate terminal 4 each have a thickness of, for example, 0.1 mm to 1.0 mm and, and in this preferred embodiment, may be about 0.6 mm.

As shown in FIGS. 1 and 2, the drain terminal 2 is defined to be wider to the extent that the semiconductor element 5 can be mounted in the interior region compared to the source element 3 and the gate element 4. The drain terminal 2 includes an island portion 7 on which the semiconductor element 5 is mounted and a terminal portion 8 in an integrated manner. The semiconductor element 5 is mounted on the island portion 7.

The semiconductor element 5 is, for example, a chip-shaped transistor (MOSFET) including a source 9 and a gate 10 on the primary surface and a drain 11 on the secondary surface. For the drawings not to be obscured, among FIGS. 1 to 6, the reference signs of the source 9, the gate 10, and the drain 11 are shown only in FIGS. 1 and 2. As shown in FIG. 1, the source 9 and the gate 10 may be pad-shaped electrodes selectively disposed on the primary surface of the semiconductor element 5. As shown in FIG. 2, the drain 11 may be an electrode disposed on the entire secondary surface of the semiconductor element 5.

The drain 11 and the island portion 7 are bonded using conductive bond (e.g. Ag paste) to bond the semiconductor element 5 to the island portion 7. This causes the drain 11 of the semiconductor element 5 to be electrically connected to the island portion 7. On the other hand, the source 9 and the gate 10 are connected, respectively, to the source terminal 3 and the gate terminal 4 using bonding wires 12, 13.

In this preferred embodiment, the terminal portion 8 is defined slightly wider than the island portion 7, with a portion thereof protruding from the end face 6C of the resin package 6 as a protruding portion 14 in a fin shape.

Most regions of the island portion 7 and the terminal portion 8 (excluding the protruding portion 14) are covered with the resin package 6, except that some regions of the secondary surface are selectively exposed out of the secondary surface 6B of the resin package 6. More specifically, as shown in the bottom view of FIG. 2, the resin package 6 is defined in a U shape including a lateral side portion 15 along the end face 6E and longitudinal side portions 16, 16 extending along the end faces 6D, 6F from the respective ends of the lateral side portion 15, and a region 17 with an opening toward the end face 6C side is defined in a central portion surrounded by the lateral side portion 15 and the longitudinal side portions 16. On the secondary surface 6B side of the resin package 6, the peripheral edges of the island portion 7 and the terminal portion 8 are supported on the lateral side portion 15 and the longitudinal side portions 16, so that the island portion 7 and the terminal portion 8 are prevented from falling off the resin package 6. On the other hand, the island portion 7 and the terminal portion 8 are exposed through the region 17 as a connecting portion 18 of the drain terminal 2 to a mounting substrate (not shown). The connecting portion 18 is exposed coplanar with the resin package 6. That is, the connecting portion 18 and the lateral side portion 15 and the longitudinal side portions 16 of the resin package 6 continue with no step.

As shown in FIGS. 1 and 2, the source terminal 3 and the gate terminal 4 are defined as lead terminals extending linearly in plan view and plurally disposed to be spaced from each other. In this preferred embodiment, a total of seven lead terminals 3, 4 are disposed such that the lead terminals 3, 4 protrude from the end face 6E of the resin package 6 opposite to the direction in which the protruding portion 14 protrudes, in which the lead terminal on one end (left end in plan view) is the gate terminal 4 and the remaining lead terminals are the source terminals 3. It is noted that the number and/or the arrangement of the source terminals 3 and the gate terminal 4 may be changed appropriately depending on, for example, the property and/or the pad position of the semiconductor element 5 mounted on the semiconductor device 1.

The source terminals 3 each include a wire bonding portion 19, a bent portion 20, and a terminal portion 21 in an integrated manner.

The wire bonding portion 19 is covered with the resin package 6 and connected to the bonding wire 12 inside the resin package 6.

The terminal portion 21 is a site to be bonded by soldering when the semiconductor device 1 is mounted on the mounting substrate. As shown in FIG. 6, the terminal portion 21 is disposed at a position away from the wire bonding portion 19 toward the secondary surface 6B side (more specifically, at a position coplanar with the secondary surface 6B of the resin package 6) on the outside of the resin package 6. That is, based on the secondary surface 6B, there is a height difference between the terminal portion 21 and the wire bonding portion 19 such that the wire bonding portion 19 is disposed at a higher position, and the bent portion 20 connects the wire bonding portion 19 and the terminal portion 21 to compensate for the height difference. It is noted that as shown in FIGS. 1 and 2, some of the source terminals 3 (in this preferred embodiment, the source terminal 3 disposed at the center) may not be bent and defined to be shorter than the other source terminals 3.

The gate terminal 4 includes a wire bonding portion 22, a bent portion 23, and a terminal portion 24 in an integrated manner.

The wire bonding portion 22 is covered with the resin package 6 and connected to the bonding wire 13 inside the resin package 6.

The terminal portion 24 is a site to be bonded by soldering when the semiconductor device 1 is mounted on the mounting substrate. As shown in FIG. 5, the terminal portion 24 is disposed at a position away from the wire bonding portion 22 toward the secondary surface 6B side (more specifically, at a position coplanar with the secondary surface 6B of the resin package 6) on the outside of the resin package 6. That is, based on the secondary surface 6B, there is a height difference between the terminal portion 24 and the wire bonding portion 22 such that the wire bonding portion 22 is disposed at a higher position, and the bent portion 23 connects the wire bonding portion 22 and the terminal portion 24 to compensate for the height difference.

The resin package 6 is defined with recessed portions 25, 26 each having a substantially semicircular shape in plan view in the respective lateral end faces 6D, 6F. The recessed portions 25, 26 are defined such that the recessed portions 25, 26 partially notch the resin package 6 from the primary surface 6A of the resin package 6 to the middle of the resin package 6 in the thickness direction (in this preferred embodiment, to the height position of the drain terminal 2 on the basis of the?/based on the secondary surface 6B of the resin package 6). Peripheral edges 27, 28 of the drain terminal 2 (terminal portion 8) are exposed through the respective recessed portions 25, 26. The peripheral edges 27, 28 are exposed at positions inward away from the end faces 6D, 6F.

Figure 8A:
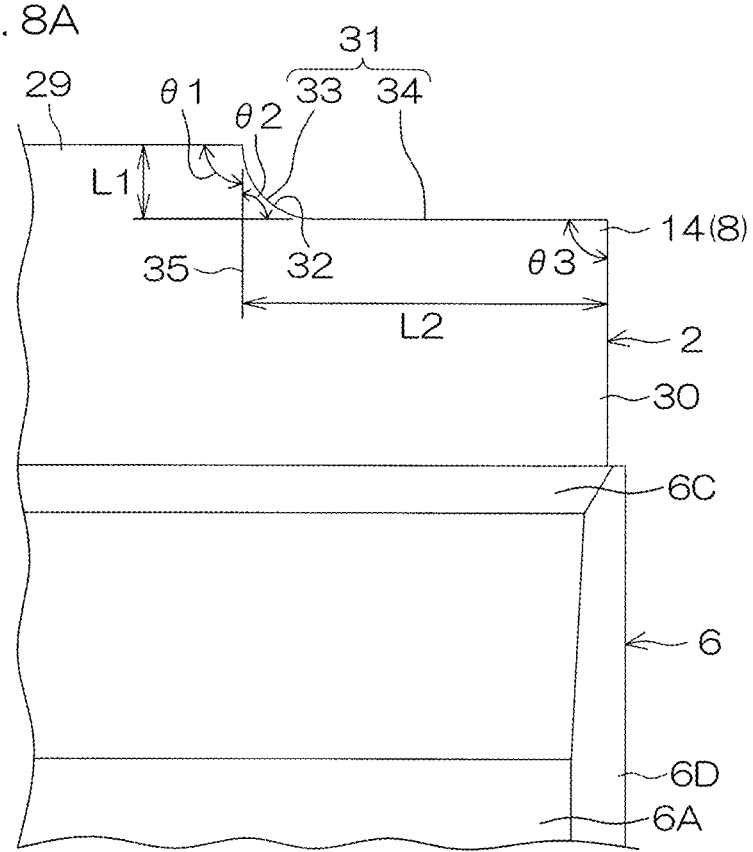
FIGS. 8A and 8B are views to describe detailed dimensions of a protruding portion in FIG. 7.
Figure 8B:
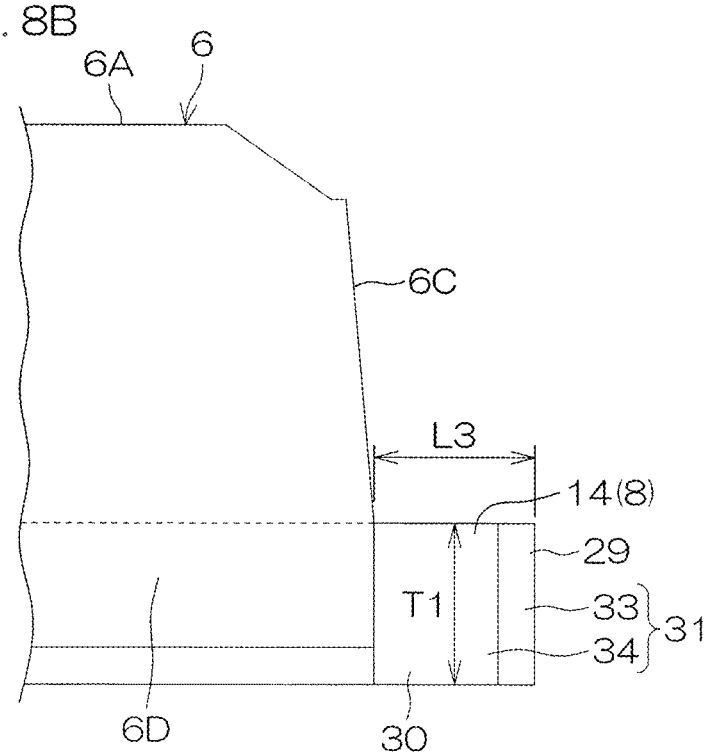

FIG. 7 is an enlarged view of a portion surrounded by alternate long and short dashed lines VII in FIG. 1. FIGS. 8A and 8B are views to describe detailed dimensions of the protruding portion 14 in FIG. 7, where FIG. 8A is a plan view and FIG. 8B is a side view. The structure of the protruding portion 14 of the drain terminal 2 will be described specifically with reference to FIGS. 7, 8A, and 8B.

First, as shown in FIG. 7, the protruding portion 14 has a width approximately equal to that of the resin package 6. The protruding portion 14 has a lateral peripheral edge 29 along the end face 6c of the resin package 6 (in this preferred embodiment, in parallel with the end face 6C), longitudinal peripheral edges 30, 30 disposed along the end faces 6D, 6F, which intersect orthogonally with the end face 6C, to be substantial extensions of the end faces 6D, 6F (in this preferred embodiment, in parallel with the end faces 6D, 6F), and corner peripheral edges 31, 31 formed by side portions that are disposed at the lateral end corners of the protruding portion 14 and continue to the lateral peripheral edge 29 and the longitudinal peripheral edges 30, 30. This causes recessed portions 32 to be defined at the both end corners of the protruding portion 14 by the corner peripheral edges 31, 31, which are shaped to be convex inward of the protruding portion 14 from the lateral peripheral edge 29 toward the longitudinal peripheral edges 30 in plan view.

As shown in FIGS. 8A and 8B, the corner peripheral edges 31 each include a first side portion 33 intersecting with the lateral peripheral edge 29 at an angle θ1 and extending toward the end face 6C of the resin package 6 and a second side portion 34 with one end thereof intersecting with the first side portion 33 at an angle θ2 and the other end intersecting with the corresponding longitudinal peripheral edge 30 at an angle θ3. The first side portion 33 and the second side portion 34 thus continue to form the corner peripheral edge 31.

More specifically, the corner peripheral edge 31 includes the first side portion 33 extending in an arc shape such that the first side portion 33 bulges from the lateral peripheral edge 29 toward the end face 6C and the linear second side portion 34 that connects the first side portion 33 and the longitudinal peripheral edge 30. In this preferred embodiment, the second side portion 34 is linear and in parallel with the lateral peripheral edge 29. This causes the intersecting portion between the first side portion 33 and the second side portion 34 to be defined in a curved shape. The intersecting portion thus defined in a curved shape allows to prevent the intersecting portion between the first side portion 33 and the second side portion 34 from being chipped off during cutting of a lead frame 36 to be described below.

Also, the angles θ1, θ2, and θ3 shown in FIG. 8A are substantially right angles, preferably 80 degrees to 100 degrees, more preferably 90 degrees to 100 degrees. In this preferred embodiment, the angles θ1, θ2, and θ3 are all 90 degrees. It is noted that as shown in FIG. 8A, when the first side portion 33 has an arc shape, the angle θ1 may be defined as the angle between a tangent 35 of the arc at the intersecting portion between the lateral peripheral edge 29 and the first side portion 33 and the lateral peripheral edge 29. Similarly, the angle θ2 may be defined as the angle between the tangent 35 and an extension of the linear second side portion 34.

Also, the ratio (L1/L2) between the length L1 of the first side portion 33 and the length L2 of the second side portion 34 is, for example, within the range of 1/10 to 10, preferably 1/5 to 5. It is noted that as shown in FIG. 8A, when the first side portion 33 has an arc shape, the length L2 of the second side portion 34 may be defined as the distance between the tangent 35 of the first side portion 33 and the longitudinal peripheral edge 30.

Also, in this preferred embodiment, the thickness T1 of the protruding portion 14 (i.e. the thickness of the drain terminal 2, the source terminal 3, and the gate terminal 4 mentioned above) is, for example, 0.1 mm to 2 mm (preferably 1.1 mm to 1.5 mm) and the protrusion amount L3 of the protruding portion 14 from the end face 6C of the resin package 6 is, for example, 0.1 mm to 2 mm.

The semiconductor device 1 is then surface-mounted and used on a mounting substrate (printed circuit board) on the surface of which circuit (pattern) wiring is defined. The drain terminal 2, the source terminal 3, and the gate terminal 4 are respectively connected by, for example, soldering to the circuit wiring on the mounting substrate. The protruding portion 14 of the drain terminal 2 also serves as a heat dissipation fin to dissipate heat generated in the semiconductor device 1 due to, for example, driving of the semiconductor element 5 into the mounting substrate. Heat dissipation from the semiconductor device 1 can also be achieved through the drain terminal 2 exposed through the recessed portions 25, 26 of the resin package 6.

Figure 11A:
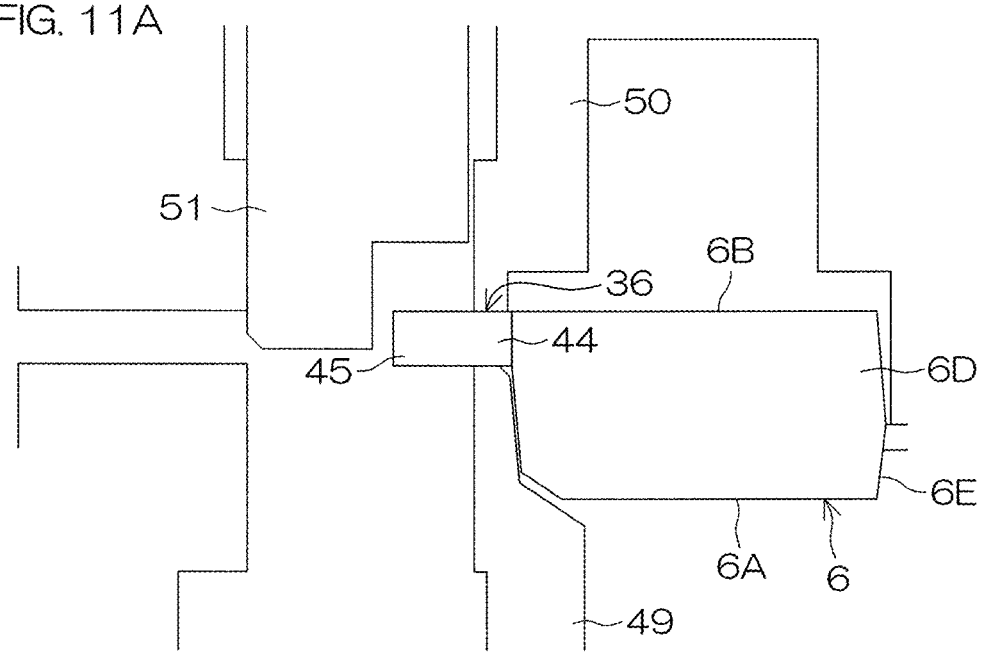
FIGS. 11A and 11B are views to describe a step related to cutting of the lead frame.
Figure 11B:
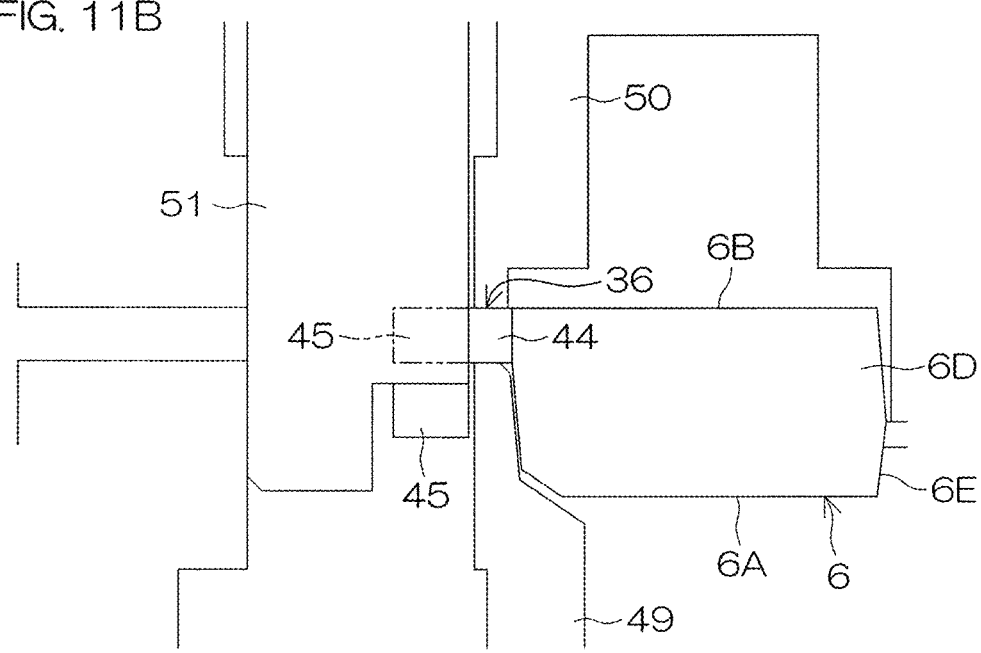

FIG. 9 is a schematic plan view of the lead frame 36 according to a preferred embodiment of the present invention. FIG. 10 is a substantial portion enlarged view of the lead frame 36. FIGS. 11A and 11B are views to describe a step related to cutting of the lead frame 36. It is noted that in FIGS. 9 to 11, those of the reference signs shown in FIGS. 1 to 8 necessary to describe a flow of manufacturing the semiconductor device 1 are only shown and the other reference signs are omitted.

Next, a method for manufacturing the semiconductor device 1 will be described with reference to FIGS. 9 to 11.

First, to manufacture the semiconductor device 1, the lead frame 36 is prepared, as shown in FIG. 9. The lead frame 36 includes a widened frame portion 37 forming the framework of the lead frame 36 and an island portion 38 and lead portions 39 integrated with and supported on the frame portion 37. The lead frame 36 is composed of a metal plate, preferably any one of Cu, Ni, an alloy thereof, 42-alloy, etc.

The lead frame 36 is defined by stamping on a metal plate and defined with multiple stamped portions (space portions 40) surrounded by the frame portion 37. More specifically, the frame portion 37 has a base frame 41 and a fin frame 42 opposite thereto extending laterally in parallel with each other and connection frames 43 extending longitudinally between the base frame 41 and the fin frame 42 to connect them. The multiple connection frames 43 are provided to be spaced from each other to partition the space portions 40 between adjacent ones of the connection frames 43.

The fin frame 42 is a site forming the protruding portion 14 to be exposed out of the resin package 6 in a fin shape, in which first portions 44 and second portions 45 each having a quadrilateral shape are arrayed laterally stepwise. This causes the connecting portion between each first portion 44 and second portion 45 to be formed as a bent portion 46 bent in a crank shape.

The island portion 38 and the lead portions 39 are disposed in each space portion 40 partitioned by the frame portion 37.

The island portion 38 is a site forming the island portion 7 of the drain terminal 2. The island portion 38 is supported on one of the first portions 44 of the fin frame 42 in a cantilevered manner and extends toward the base frame 41 side.

The lead portions 39 are sites forming the source terminals 3 and the gate terminal 4, supported on the base frame 41 in a cantilevered manner in the same number as the terminals 3, 4, and extend toward the fin frame 42 side. A linking portion 47 used to collectively connect the multiple lead portions 39 is defined in a substantially central portion of each lead portions 39 in the longitudinal direction to prevent the elongated lead portions 39 from being displaced during manufacturing of the semiconductor device 1 (e.g. during bonding of the bonding wires 12, 13).

After the preparation of the lead frame 36, a semiconductor element 5 is bonded to each island portion 38. The semiconductor element 5 is bonded to each island portion 38 using, for example, conductive bond (e.g. Ag paste). Next, the source 9 and the gate 10 of the semiconductor element 5 are connected, respectively, to the lead portions 39 corresponding to the source terminal 3 and the gate terminal 4 using bonding wires 12, 13, though not shown in FIGS. 9 to 11.

Next, mold resin is selectively poured onto the lead frame 36 to encapsulate the semiconductor element 5, the island portion 38, and a portion of the lead portions 39 with a resin package 6.

Next, the lead frame 36 is cut along a cut line 48 set at the bent portion 46 as indicated by the broken line in FIG. 10 so that the second portions 45 of the fin frame 42 is separated from the first portions 44. The boundary portions between the lead portions 39 and the base frame 41 as well as the linking portion 47 are also cut so that the base frame 41 is separated from the lead portions 39. This causes each semiconductor device 1 to be cut from the lead frame 36 into a single piece. Each first portion 44 of the fin frame 42 remaining after the cutting is defined as a protruding portion 14 of the drain terminal 2 and each corner peripheral edge 31 is defined in a shape following the cut line 48. The lead portions 39 are also defined as the source terminals 3 and the gate terminal 4.

The cutting step described above may be performed, for example, as shown in FIGS. 11A and 11B. First, as shown in FIG. 11A, left portions of the lead frame 36 after encapsulation with the resin package 6 (i.e. the first portions 44 of the fin frame 42 and the lead portions 39) are supported through the primary surface side of the lead frame 36 (the primary surface 6A side of the resin package 6) on a dedicated die 49 as an example of the support member according to the present invention, while the secondary surface side of the lead frame 36 (the secondary surface 6B side of the resin package 6) is held by a stripper 50.

Next, as shown in FIG. 11B, unnecessary portions of the lead frame 36 (the second portions 45 of the fin frame 42 are only shown in FIG. 11B) are stamped by a punch 51 as an example of the stamping member according to the present invention from the secondary surface side toward the primary surface side of the lead frame. This punching allows not only the second portions 45 but also the base frame 41 and the linking portion 47 to be stamped at the same time.

In accordance with the method above, since the lead frame 36 is cut in a pattern in which each corner peripheral edge 31 of the protruding portion 14 of the drain terminal 2 includes such a first side portion 33 and a second side portion 34 as shown in FIG. 8A, it is possible to reduce the occurrence of a burr at the corners of the protruding portion 14 after cutting. Accordingly, the resulting semiconductor device 1 has no burr remaining around the peripheral edge of the protruding portion 14 of the drain terminal 2 and thereby highly reliable semiconductor device can be provided.

FIG. 12 is a plan view of a semiconductor device 61 according to another preferred embodiment of the present invention. FIG. 13 is a bottom view of the semiconductor device 61 according to another preferred embodiment of the present invention. FIG. 14 is a front view of the semiconductor device 61 according to another preferred embodiment of the present invention. FIG. 15 is a back view of the semiconductor device 61 according to another preferred embodiment of the present invention. FIG. 16 is a left side view of the semiconductor device 61 according to another preferred embodiment of the present invention. FIG. 17 is a right side view of the semiconductor device 61 according to another preferred embodiment of the present invention. In FIGS. 12 to 17, components identical to those shown in FIGS. 1 to 8 are designated by the same reference signs and will not be described.

In the semiconductor device 61, the protruding portion 14 of the drain terminal 2 has a width smaller than that of the resin package 6 (in this preferred embodiment, a width approximately half that of the resin package 6). The narrowed protruding portion 14 protrudes from a substantially central portion of the end face 6C in the width direction with equal spaces from the respective end faces 6D, 6F of the resin package 6. Accordingly, portions of the end face 6C of the resin package 6 are defined on either lateral side of the protruding portion 14 in a back view shown in FIG. 15.

The drain terminal 2 is also defined with sideward extending portions 62, 62 extending from the side edges of the island portion 7 toward the respective end faces 6D, 6F of the resin package 6. The sideward extending portions 62, 62 extend collinearly from the side edges of the island portion 7 in mutually opposite directions to be protruded and exposed out of the end faces 6D, 6F of the resin package 6.

Also, in the semiconductor device 61, one source terminal 63 and one gate terminal 64 are provided that are wider than the source terminals 3 and the gate terminal 4, respectively, shown in FIGS. 1 and 2. The source terminal 63 and the gate terminal 64 are disposed coplanar with the drain terminal 2, with portions thereof protruding from the end face 6E of the resin package 6 as protruding portions 65, 66 in a fin shape. Corner peripheral edges 67, 68 and recessed portions 69, 70 having the same shape as the corner peripheral edges 31 and the recessed portions 32 illustrated in FIG. 8A are defined at the lateral end corners of each protruding portion 65, 66. In a similar manner as the connecting portion 18 of the drain terminal 2, some regions of the secondary surfaces of the source terminal 63 and the gate terminal 64 are also selectively exposed through the secondary surface 6B of the resin package 6 as connecting portions 71, 72.

In the semiconductor device 61, not only in the protruding portion 14 of the drain terminal 2, but also in the source terminal 63 and the gate terminal 64 protruding in a fin shape, the corner peripheral edges 67, 68 are defined in such a pattern as including the first side portion 33 and the second side portion 34 shown in FIG. 8A. It is therefore possible to reduce the occurrence of a burr at the corners of the protruding portions 65, 66 after cutting of the lead frame also during manufacturing of the semiconductor device 61.

While the preferred embodiments of the present invention have heretofore been described, the present invention can also be practiced in other forms.

Figure 18:
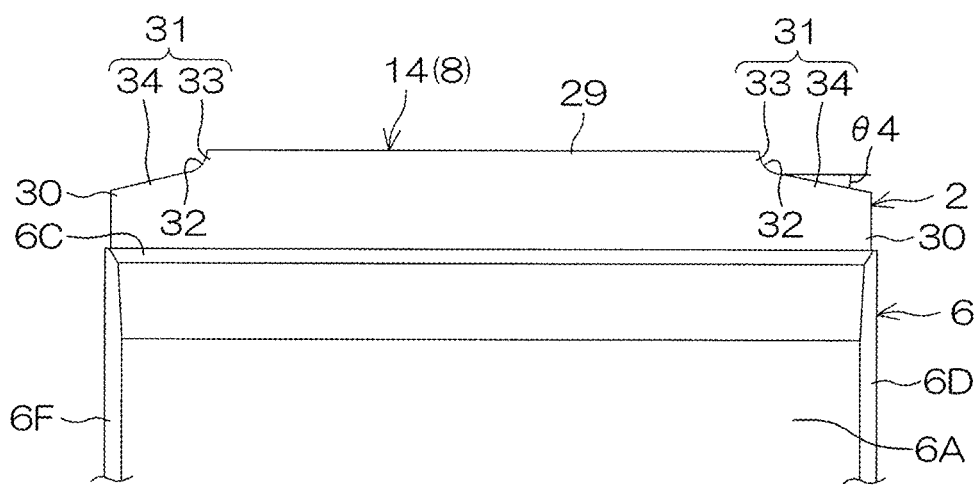
FIG. 18 is a substantial portion enlarged view of a semiconductor device according to still another preferred embodiment of the present invention.

For example, the second side portion 34 of each corner peripheral edge 31 may not necessarily be in parallel with the lateral peripheral edge 29 as shown in FIG. 8A, but may be linearly inclined with respect to the lateral peripheral edge 29 as shown in FIG. 18. In this case, the inclination angle θ4 may be, for example, 5 degrees to 30 degrees.

Figure 19:
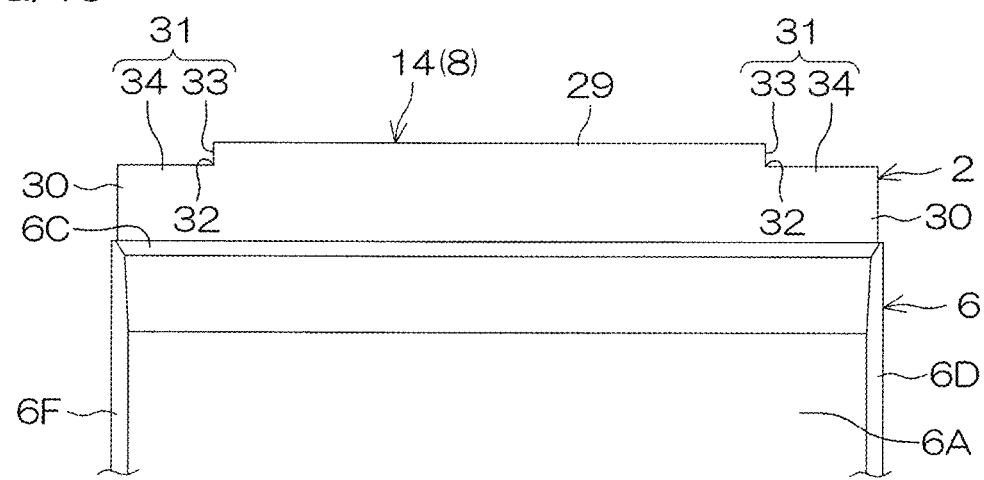
FIG. 19 is a substantial portion enlarged view of a semiconductor device according to still another preferred embodiment of the present invention.

Also, the first side portion 33 of each corner peripheral edge 31 may not necessarily have an arc shape as shown in FIG. 8A, but may linearly intersect orthogonally with the lateral peripheral edge 29 and the second side portion 34 as shown in FIG. 19.

Further, in the above-mentioned preferred embodiments, although all of the protruding portions 14, 65, 66 partially form external terminals electrically connected to the semiconductor element 5, these portions may be, for example, heat dissipation fins provided just for heat dissipation from the semiconductor devices 1, 61 (i.e. electrically disconnected from the semiconductor element 5).

In addition, in the above-mentioned preferred embodiments, while a MOSFET transistor chip is exemplified as a device structure of the semiconductor element 5, the present invention may include another semiconductor element such as an IGBT, a JFET, or a Schottky barrier diode.

Various other design changes may be made within the scope of the items described in the claims.

This application corresponds to Japanese Patent Application No. 2017-063198 filed in the Japan Patent Office on Mar. 28, 2017, the disclosure of which is incorporated herein by reference in its entirety.

EXAMPLE 1

Next, the present invention will be described based on an example and a comparative example, but not intended to be limited to the following example.

The following is the occurrence evaluation of burrs for three stamping patterns according to an example, a comparative example, and a reference example made as for the above-mentioned corner shape of the protruding portion 14 of the drain terminal 2. The design shape of the protruding portion 14 according to the example, the comparative example, and the reference example is as shown, respectively, in FIGS. 20A, 21A, and 22A.

Figure 20A:
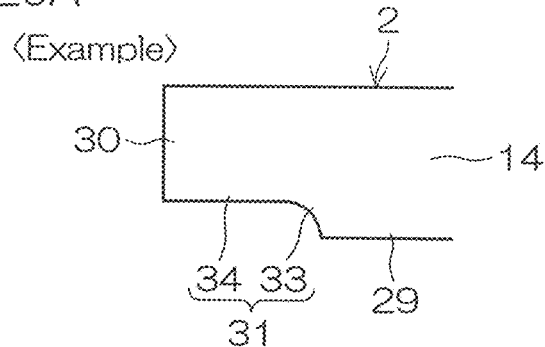
FIGS. 20A to 20D are views to confirm the occurrence evaluation of burrs according to an example.

That is, as shown in FIG. 20A, in a similar as the above-mentioned preferred embodiments, the example has a corner peripheral edge 31 including a first side portion 33 intersecting with the lateral peripheral edge 29 at 90 degrees and extending toward the end face 6C of the resin package 6 and a second side portion 34 intersecting with the first side portion 33 and the longitudinal peripheral edge 30 at 90 degrees.

Figure 21A:
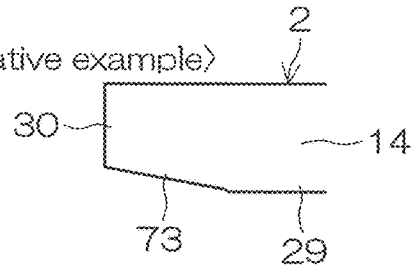
FIGS. 21A to 21E are views to confirm the occurrence evaluation of burrs according to a comparative example.

As shown in FIG. 21A, the comparative example has a linear corner peripheral edge 73 not including the first side portion 33 but inclined from the lateral peripheral edge 29 toward the longitudinal peripheral edge 30.

Figure 22A:
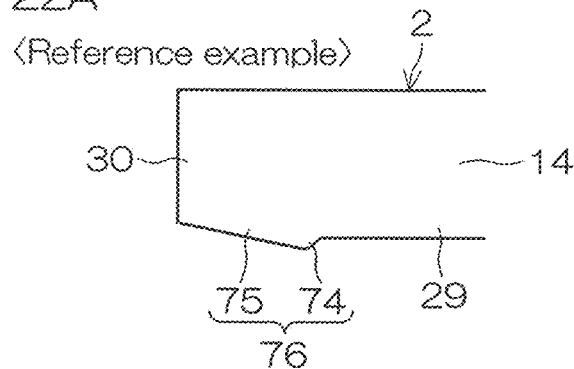
FIGS. 22A to 22D are views to confirm the occurrence evaluation of burrs according to a reference example.

As shown in FIG. 22A, the reference example has a corner peripheral edge 76 including a first side portion 74 inclined with respect to the lateral peripheral edge 29 and extending in the direction opposite to that of the first side portion 33 in the example (in FIG. 8A, in a direction away from the end face 6C of the resin package 6) and a linear second side portion 75 inclined with respect to the lateral peripheral edge 29 from the first side portion 74 toward the longitudinal peripheral edge 30.

Figure 20B:
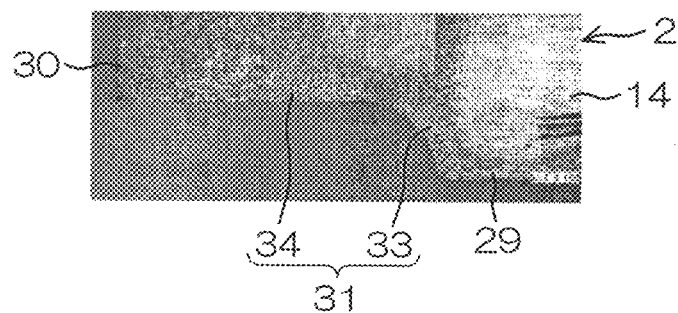
Figure 20C:
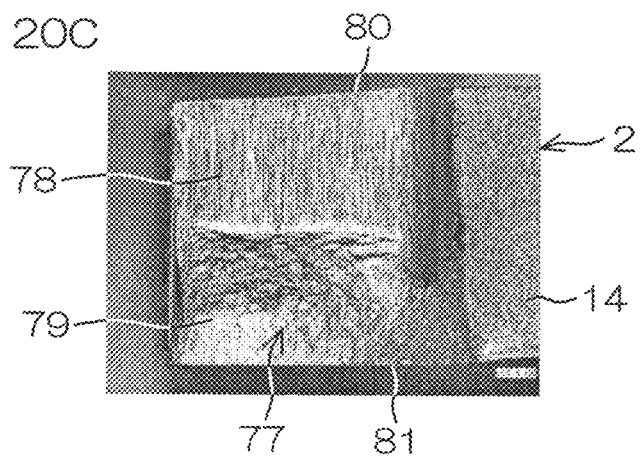
Figure 20D:
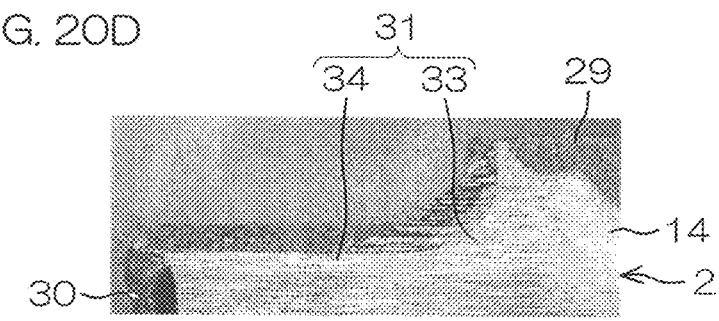
Figure 21B:
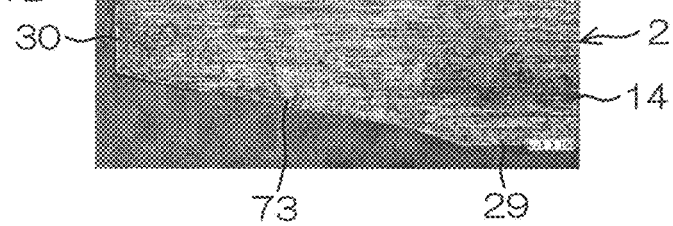
Figure 21C:
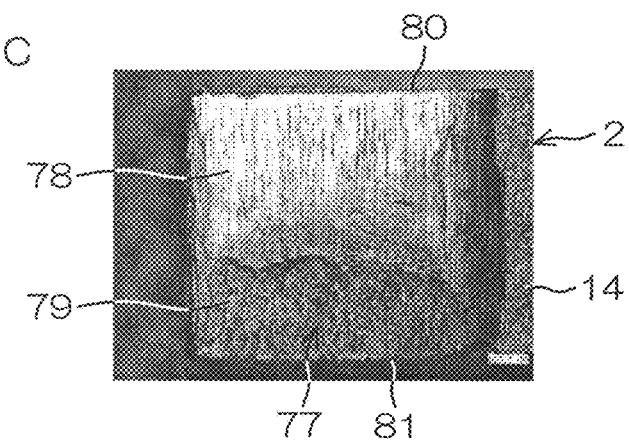
Figure 21D:
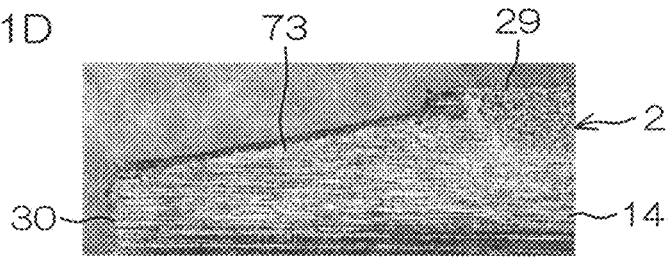
Figure 21E:
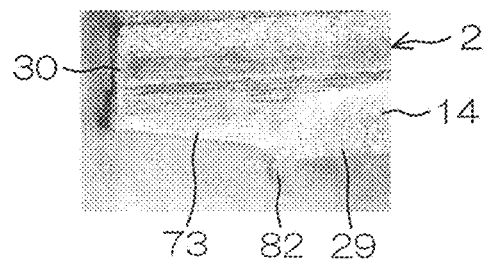
Figure 22B:
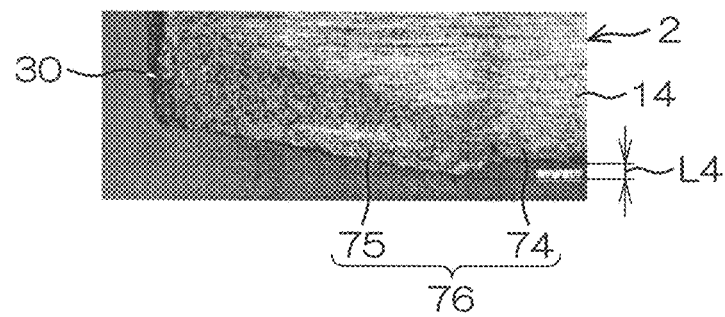
Figure 22C:
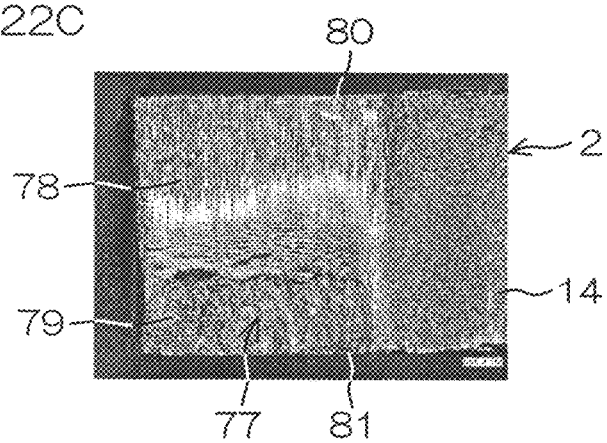
Figure 22D:
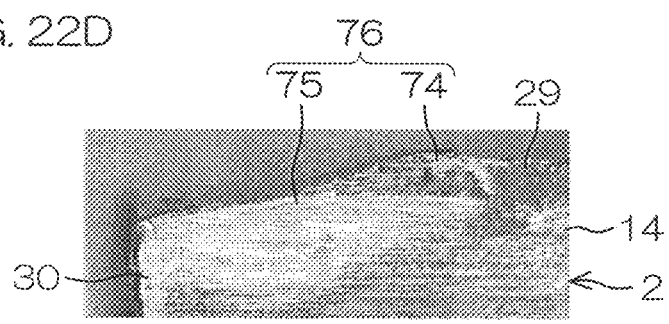

The lead frame was selectively stamped from the secondary surface side of the resin package according to the manufacturing process illustrated in FIGS. 9 to 11 to achieve the above-described design shapes of the protruding portion 14. The shape of each actually obtained protruding portion 14 was imaged with a scanning electron microscope (SEM) at various angles. The acquired SEM images are shown in FIGS. 20B to 20D (example), FIGS. 21B to 21E (comparative example), and FIGS. 22B to 22D (reference example). FIGS. 20B, 21B, and 22B show images of the secondary surface of each protruding portion 14, FIGS. 20C, 21C, and 22C show images of the cut surface (end face of each protruding portion 14) after stamping, and FIGS. 20D, 21D, and 22D show images of the primary surface of each protruding portion 14. Also, FIG. 21E is an enlarged view of a burr according to the comparative example.

<Evaluation>

As shown in FIGS. 20B to 20D, in the example according to the above-mentioned preferred embodiments, no burr occurred at the corners of the protruding portion 14. Also, as shown in FIG. 20C, a plated layer (e.g. Sn plated layer) on the lead frame was led by the punch 51 to extend from a secondary surface 80 to a primary surface 81 side of the protruding portion 14 upon stamping of the lead frame, so that a plating region 78 was defined on an end face 77 of the protruding portion 14 from the secondary surface 80 to the middle in the thickness direction. On the other hand, the region covering an area from the primary surface 81 of the protruding portion 14 to the plating region 78 was a base region 79 in which the base (e.g. Cu) of the lead frame remained.

In contrast, as shown in FIGS. 21B to 21E (particularly in FIG. 21E), the comparative example resulted in that a burr 82 occurred in an end portion of the lateral peripheral edge 29.

On the other hand, as shown in FIGS. 22A to 22D, the reference example observed no burr occurrence, but since the first side portion 74 was defined to extend outward from the protruding portion 14, it was found that the size of the semiconductor device increased by the extension amount L4 of the first side portion 74 compared to the example. This is inferior to the example with respect to space saving in light of recent refinement of printed circuit boards.

REFERENCE SIGNS LIST

1: Semiconductor device
2: Drain terminal
3: Source terminal
4: Gate terminal
5: Semiconductor element
6: Resin package
7: Island portion
8: Terminal portion
9: Source
10: Gate
11: Drain
12: Bonding wire
13: Bonding wire
14: Protruding portion
15: Lateral side portion
16: Longitudinal side portion
17: Region
18: Connecting portion
19: Wire bonding portion
20: Bent portion
21: Terminal portion
22: Wire bonding portion
23: Bent portion
24: Terminal portion
25: Recessed portion
26: Recessed portion
27: Peripheral edge
28: Peripheral edge
29: Lateral peripheral edge
30: Longitudinal peripheral edge
31: Corner peripheral edge
32: Recessed portion
33: First side portion
34: Second side portion
35: Tangent
36: Lead frame
37: Frame portion
38: Island portion
39: Lead portion
40: Space portion
41: Base frame
42: Fin frame
43: Connection frame
44: First portion
45: Second portion
46: Bent portion
47: Linking portion
48: Cut line
49: Die
50: Stripper
51: Punch
61: Semiconductor device
62: Sideward extending portion
63: Source terminal
64: Gate terminal
65: Protruding portion
66: Protruding portion
67: Corner peripheral edge
68: Corner peripheral edge
69: Recessed portion
70: Recessed portion
71: Connecting portion
72: Connecting portion
73: Corner peripheral edge
74: First side portion
75: Second side portion
76: Corner peripheral edge
77: End face
78: Plating region
79: Base region
80: Secondary surface
81: Primary surface
82: Burr

The invention claimed is:

1. A semiconductor device comprising:
a semiconductor element;
a packaging material that encapsulates the semiconductor element and forms an exterior surface of the semiconductor device, the packaging material having a front surface, a rear surface opposite to the front surface, and an end face connecting the front surface and the rear surface; and
a metal member electrically connected to the semiconductor element and having an island portion on which the semiconductor element is mounted, and a protruding portion protruding from the end face of the packaging material and having a front surface and a rear surface that are exposed from the package material, wherein
the protruding portion has a lateral peripheral edge forming an end portion of the protruding portion opposite to the end face of the packaging material such that the lateral peripheral edge is apart from the end face of the packaging material and extends along a direction parallel to the end face of the packaging material, a longitudinal peripheral edge along the normal direction of the end face, and a corner peripheral edge formed by side portions that are disposed at the corners of the protruding portion and continue to the lateral peripheral edge and the longitudinal peripheral edge, wherein
the corner peripheral edge includes a first side portion intersecting substantially orthogonally with the lateral peripheral edge and extending toward the end face of the packaging material and a second side portion with one end thereof intersecting substantially orthogonally with the first side portion and the other end intersecting substantially orthogonally with the longitudinal peripheral edge, wherein
an intersecting portion between the first side portion and the second side portion includes a curved shape portion that bulges toward the packaging material and has a center point of curvature facing the packaging material, wherein
the protruding portion of the metal member includes a heat dissipation fin to dissipate heat generated in the semiconductor device and has a maximum width in a direction parallel to the end face of the packaging material which is approximately the same as a width of the end face of the packaging material, wherein most of a surface of the island portion opposite to the semiconductor element is exposed from the rear surface of the packaging material, wherein
the lateral peripheral edge and the longitudinal peripheral edge are outermost peripheral edges of the semiconductor device, and the corner peripheral edge is formed only at a corner of the outermost peripheral edges, wherein
the front surface of the protruding portion is extended outwardly from a middle part of the end face of the packaging material in a thickness direction of the packaging material, wherein
the rear surface of the protruding portion is opposite to the front surface of the protruding portion in the thickness direction of the packaging material such that the rear surface of the protruding portion is on the same level plane with the rear surface of the packaging material, wherein
the corner peripheral edge has the same plan view from the front surface of the protruding portion to the rear surface of the protruding portion, and wherein
a length L2 of the second side portion is longer than a length L1 of the first side portion.

2. The semiconductor device according to claim 1, wherein an angle θ1 between the lateral peripheral edge and the first side portion, an angle θ2 between the first side portion and the second side portion, and an angle θ3 between the second side portion and the longitudinal peripheral edge are all 90 degrees.

3. The semiconductor device according to claim 1, wherein the ratio (L1/L2) between the length L1 of the first side portion and the length L2 of the second side portion is within the range of 1/10 to 10.

4. The semiconductor device according to claim 1, wherein the thickness T1 of the protruding portion is 0.1 mm to 2 mm and the protrusion amount L3 of the protruding portion from the end face of the packaging material is 0.1 mm to 2 mm.

5. The semiconductor device according to claim 1, wherein the second side portion is defined in parallel with the lateral peripheral edge.

6. The semiconductor device according to claim 1, wherein the second side portion is defined to be inclined with respect to the lateral peripheral edge.

7. The semiconductor device according to claim 1, wherein an end face of the protruding portion includes a plating region covering an area from a secondary surface side of the protruding portion to the middle in the thickness direction and a base region of the metal member covering an area from a primary surface side of the protruding portion to the plating region.

8. The semiconductor device according to claim 1, wherein a pair of the longitudinal peripheral edges extend from the corner peripheral edge to the end face of the packaging material with a constant distance between each other, and
the maximum width includes a distance between the one longitudinal peripheral edge and the other longitudinal peripheral edge.

9. The semiconductor device according to claim 1, wherein
the semiconductor element includes a transistor chip, and wherein
the metal member includes a drain terminal connected to a drain of the transistor chip.

10. The semiconductor device according to claim 1, wherein
the semiconductor element includes a transistor chip, and wherein
the metal member includes a source terminal connected to a source of the transistor chip.

11. The semiconductor device according to claim 1, wherein
the semiconductor element includes a transistor chip, and wherein
the metal member includes a gate terminal connected to a gate of the transistor chip.

12. The semiconductor device according to claim 1, wherein a portion of the island portion supporting the semiconductor element in a thickness direction of the island portion is exposed from the rear surface of the packaging material.

13. The semiconductor device according to claim 1, wherein
the metal member includes a plurality of terminals protruding only from a second end face of the packaging material opposite the end face of the packaging material from which the protruding portion is protruded, and wherein
the plurality of terminals includes a plurality of first terminals each having a bent portion and a second terminal shorter than the first terminals such that the second terminal is at the same potential as the first terminals and is not bended.

14. The semiconductor device according to claim 13, wherein
the semiconductor element includes a transistor chip, and wherein
each of the plurality of first terminals and the second terminal includes a source terminal connected to a source of the transistor chip.

15. The semiconductor device according to claim 14, wherein
the plurality of terminals further includes a gate terminal connected to a gate of the transistor chip, and wherein
the gate terminal has a bent portion such that the gate terminal has a same length as each of the first terminals.

16. A semiconductor device manufacturing method comprising:
a step of mounting a semiconductor element on a lead frame;
a step of encapsulating the semiconductor element with a packaging material such that the lead frame is partially exposed, the packaging material forming an exterior surface of the semiconductor device, the packaging material having a front surface, a rear surface opposite to the front surface, and an end face connecting the front surface and the rear surface; and
a step of cutting the lead frame in a predetermined pattern to separate the packaging material from the lead frame while leaving the lead frame remaining on the packaging material side as a metal member that has an island portion on which the semiconductor element is mounted, and a protruding portion protruding from the end face of the packaging material and having a front surface and a rear surface that are exposed from the package material, wherein
a peripheral edge of the protruding portion that appears by cutting the predetermined pattern has a lateral peripheral edge forming an end portion of the protruding portion opposite to the end face of the packaging material such that the lateral peripheral edge is apart from the end face of the packaging material and extends along a direction parallel to the end face of the packaging material, a longitudinal peripheral edge along the normal direction of the end face, and a corner peripheral edge formed by side portions that are disposed at the corners of the protruding portion and continue to the lateral peripheral edge and the longitudinal peripheral edge, wherein the corner peripheral edge includes a first side portion intersecting substantially orthogonally with the lateral peripheral edge and extending toward the end face of the packaging material and a second side portion with one end thereof intersecting substantially orthogonally with the first side portion and the other end intersecting substantially orthogonally with the longitudinal peripheral edge, wherein an intersecting portion between the first side portion and the second side portion includes a curved shape portion which bulges toward the packaging material and has a center point of curvature facing the packaging material, wherein the protruding portion of the metal member includes a heat dissipation fin to dissipate heat generated in the semiconductor device and has a maximum width in a direction parallel to the end face of the packaging material which is approximately the same as a width of the end face of the packaging material, wherein most of a surface of the island portion opposite to the semiconductor element is exposed from the rear surface of the packaging material, wherein the lateral peripheral edge and the longitudinal peripheral edge are outermost peripheral edges of the semiconductor device, and the corner peripheral edge is formed only at a corner of the outermost peripheral edges, wherein the front surface of the protruding portion is extended outwardly from a middle part of the end face of the packaging material in a thickness direction of the packaging material, wherein the rear surface of the protruding portion is opposite to the front surface of the protruding portion in the thickness direction of the packaging material such that the rear surface of the protruding portion is on the same level plane with the rear surface of the packaging material, wherein the corner peripheral edge has the same plan view from the front surface of the protruding portion to the rear surface of the protruding portion, and wherein a length L2 of the second side portion is longer than a length L1 of the first side portion.

17. The semiconductor device manufacturing method according to claim 16, wherein the step of cutting the lead frame includes a step of cutting a portion of the lead frame not supported on a support member from a secondary side of the lead frame while a portion remains as the protruding portion of the metal member supported through a primary side of the lead frame on the support member.

18. The semiconductor device manufacturing method according to claim 17, wherein the step of cutting the lead frame includes a step of stamping an unnecessary portion of the lead frame not supported on the support member with a stamping member.

19. The semiconductor device manufacturing method according to claim 16, wherein a portion of the island portion supporting the semiconductor element in a thickness direction of the island portion is exposed from the rear surface of the packaging material.

* * * * *